United States Patent
Cheon et al.

(10) Patent No.: US 9,202,969 B2
(45) Date of Patent: Dec. 1, 2015

(54) NITRIDE SEMICONDUCTOR LIGHT EMITTING DEVICE AND METHOD OF MANUFACTURING THE SAME

(71) Applicant: SAMSUNG ELECTRONICS CO., LTD., Suwon-Si, Gyeonggi-Do (KR)

(72) Inventors: Joo Young Cheon, Gyeonggi-Do (KR); Yu Ri Sohn, Seoul (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/534,839

(22) Filed: Nov. 6, 2014

(65) Prior Publication Data

US 2015/0060764 A1 Mar. 5, 2015

Related U.S. Application Data

(63) Continuation of application No. 13/787,136, filed on Mar. 6, 2013, now Pat. No. 8,932,943.

(30) Foreign Application Priority Data

Mar. 7, 2012 (KR) ........................ 10-2012-0023264

(51) Int. Cl.
| | |
|---|---|
| *H01L 29/06* | (2006.01) |
| *H01L 33/04* | (2010.01) |
| *H01L 33/00* | (2010.01) |
| *H01L 33/32* | (2010.01) |

(52) U.S. Cl.
CPC .............. *H01L 33/04* (2013.01); *H01L 33/007* (2013.01); *H01L 33/32* (2013.01)

(58) Field of Classification Search
USPC ..................................................... 257/13, 15
See application file for complete search history.

(56) References Cited

U.S. PATENT DOCUMENTS

| 6,372,608 B1 | 4/2002 | Shimoda et al. |
|---|---|---|
| 6,645,830 B2 | 11/2003 | Shimoda et al. |
| RE38,466 E | 3/2004 | Inoue et al. |

(Continued)

FOREIGN PATENT DOCUMENTS

| JP | 2005-032893 | 2/2005 |
|---|---|---|
| JP | 2006-515713 | 6/2006 |

(Continued)

OTHER PUBLICATIONS

WO2004-051719 is the counterpart to JP2006-515713.

*Primary Examiner* — Reema Patel
(74) *Attorney, Agent, or Firm* — F. Chau & Associates, LLC

(57) ABSTRACT

A method of manufacturing a nitride semiconductor light emitting device which includes forming an n-type semiconductor layer, forming an active layer on the n-type semiconductor layer, forming a superlattice layer by alternately stacking at least two nitride layers made of $In_xAl_yGa_{(1-x-y)}N$ ($0 \le x \le 1$, $0 \le y \le 1$, and $0 \le x+y \le 1$) having different energy bandgaps from each other and doped with a p-type dopant, and forming a p-type semiconductor layer on the superlattice layer. The forming of the superlattice layer is performed by adjusting a flow rate of a p-type dopant source gas to reduce the flow rate in a growth termination period of the superlattice layer by no greater than about half of the flow rate in a growth initiation period of the superlattice layer while being doped with the p-type dopant.

16 Claims, 5 Drawing Sheets

(56) References Cited

U.S. PATENT DOCUMENTS

| | | |
|---|---|---|
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,193,246 B1 | 3/2007 | Tanizawa et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 2002/0171092 A1 | 11/2002 | Goetz et al. |
| 2009/0014713 A1* | 1/2009 | Kang et al. .............. 257/13 |
| 2012/0319080 A1* | 12/2012 | Fudeta et al. ............ 257/13 |

FOREIGN PATENT DOCUMENTS

| | | | |
|---|---|---|---|
| KR | 1020090079993 | 7/2009 | |
| KR | 1020100069676 | 6/2010 | |
| WO | 2004051719 | 6/2004 | |
| WO | WO 2011102411 A1 * | 8/2011 | ............ H01L 33/32 |

* cited by examiner

NITRIDE SEMICONDUCTOR LIGHT EMITTING DEVICE AND METHOD OF MANUFACTURING THE SAME

CROSS-REFERENCE TO RELATED APPLICATIONS

This application is a Continuation of U.S. patent application Ser. No. 13/787,136, filed on Mar. 6, 2013, which claims priority to Korean Patent Application No. 10-2012-0023264 filed on Mar. 7, 2012, the disclosures of which are hereby incorporated by reference herein in their entirety.

TECHNICAL FIELD

The present disclosure relates to a semiconductor light emitting device and a method of manufacturing the same.

DISCUSSION OF THE RELATED ART

Semiconductor light emitting diodes (LEDs) emit light by converting electrical signals into infrared light, visible light and ultraviolet light, using the characteristics of compound semiconductors. These semiconductor LEDs may be beneficial over filament-based light emitting devices in that they have a long lifespan, low power consumption, superior initial-operating characteristics, and high vibration resistance. These factors have continually boosted the demand for semiconductor LEDs. Notably of late, group III nitride semiconductors that can emit light in a blue/short wavelength region have drawn a great deal of attention.

Such group III nitride semiconductors commonly include, for example, an active layer having a multi-quantum-well (MQW) structure between n-type and p-type nitride semiconductor layers, and the recombination of electrons and holes in the active layer leads to the emission of light.

Light emission efficiency of the nitride semiconductor may be determined by the possibility of the recombination of electrons and holes in the active layer, e.g., internal quantum efficiency. Accordingly, approaches to increase the light emission efficiency of nitride semiconductors have focused on increasing the internal quantum efficiency. To increase internal quantum efficiency, research into modifying the structure of the active layer, and increasing carrier effective mass, or the like, is being actively conducted. As an example of a method of increasing internal quantum efficiency, the formation of a superlattice layer within a light emitting device has been developed.

SUMMARY OF THE INVENTION

Exemplary embodiments of the present invention provide a method of manufacturing a light emitting device capable of increasing light emission efficiency.

According to an exemplary embodiment of the present invention, there is provided a method of manufacturing a nitride semiconductor light emitting device. The method includes forming an n-type semiconductor layer, forming an active layer on the n-type semiconductor layer, forming a superlattice layer on the active layer by alternately stacking at least two nitride layers made of $In_xAl_yGa_{(1-x-y)}N$ ($0 \le x \le 1$, $0 \le y \le 1$, and $0 \le x+y \le 1$) having different energy bandgaps from each other and doped with a p-type dopant and forming a p-type semiconductor layer on the superlattice layer. The forming of the superlattice layer is performed by adjusting a flow rate of a p-type dopant source gas to reduce the flow rate in a growth termination period of the superlattice layer by no greater than about half of the flow rate in a growth initiation period of the superlattice layer while being doped with the p-type dopant.

The p-type dopant may include magnesium (Mg).

The p-type dopant source gas may include Bis (cyclopentadienyl) magnesium ($Cp_2Mg$).

The superlattice layer may have a doping concentration of about $1 \times 10^{19}/cm^3$ to about $1 \times 10^{20}/cm^3$.

The forming of the superlattice layer may be performed by reducing the flow rate of the p-type dopant source gas by no greater than about half when a thickness of the superlattice layer is about half of a desired thickness thereof.

The superlattice layer may be formed by alternately stacking the nitride layers made of $In_xAl_yGa_{(1-x-y)}N$ ($0 \le x \le 1$, $0 \le y \le 1$, and $0 \le x+y \le 1$) in amounts of about three to about one hundred periods.

The superlattice layer may be formed by alternately stacking a plurality of aluminum-gallium-nitride (AlGaN)/gallium nitride (GaN)/indium gallium nitride (InGaN) layers.

According to an exemplary embodiment of the present invention, there is provided a nitride semiconductor light emitting device, including: an n-type semiconductor layer, an active layer, a p-type semiconductor layer and a superlattice layer disposed between the active layer and the p-type semiconductor layer. The superlattice layer includes a plurality of alternatively stacked nitride layers including $In_xAl_yGa_{(1-x-y)}N$ ($0 \le x \le 1$, $0 \le y \le 1$, and $0 \le x+y \le 1$) having different energy bandgaps from each other. The superlattice layer includes a p-type dopant and has a doping concentration of about $1 \times 10^{19}/cm^3$ to about $1 \times 10^{20}/cm^3$.

The p-type dopant may include magnesium (Mg).

The superlattice layer includes the plurality of alternately stacked nitride layers including $In_xAl_yGa_{(1-x-y)}N$ ($0 \le x \le 1$, $0 \le y \le 1$, and $0 \le x+y \le 1$) in amounts of about three to about one hundred periods.

The superlattice layer may include a plurality of aluminum-gallium-nitride (AlGaN)/gallium nitride (GaN)/indium-gallium nitride (InGaN) layers which are alternatively stacked.

A method of manufacturing a nitride semiconductor light emitting device including forming an undoped semiconductor layer on a substrate, forming an n-type semiconductor layer on the undoped semiconductor layer, forming a first superlattice layer on the n-type semiconductor layer by alternately stacking at least two nitride layers made of $In_xAl_yGa_{(1-x-y)}N$ ($0 \le x \le 1$, $0 \le y \le 1$, and $0 \le x+y \le 1$) having different energy bandgaps from each other and doped with an n-type dopant, forming an active layer on the first superlattice layer, and forming a second superlattice layer on the active layer by alternately stacking at least two nitride layers made of $In_xAl_yGa_{(1-x-y)}N$ ($0 \le x \le 1$, $0 \le y \le 1$, and $0 \le x+y \le 1$) having different energy bandgaps from each other and doped with a p-type dopant.

In addition, the method further includes forming a p-type semiconductor layer on the second superlattice layer, forming a transparent electrode layer on the p-type semiconductor layer, forming an n-type electrode on an exposed portion of the n-type semiconductor layer and forming a p-type electrode on the transparent electrode layer. The forming of the second superlattice layer is performed by adjusting a flow rate of a p-type dopant source gas to reduce the flow rate in a growth termination period of the second superlattice layer by no greater than about half of the flow rate in a growth initiation period of the second superlattice layer while being doped with the p-type dopant.

BRIEF DESCRIPTION OF THE DRAWINGS

Exemplary embodiments of the present invention can be understood in more detail from the following detailed description taken in conjunction with the accompanying drawings, in which.

DETAILED DESCRIPTION OF EXEMPLARY EMBODIMENTS

Figure 1:
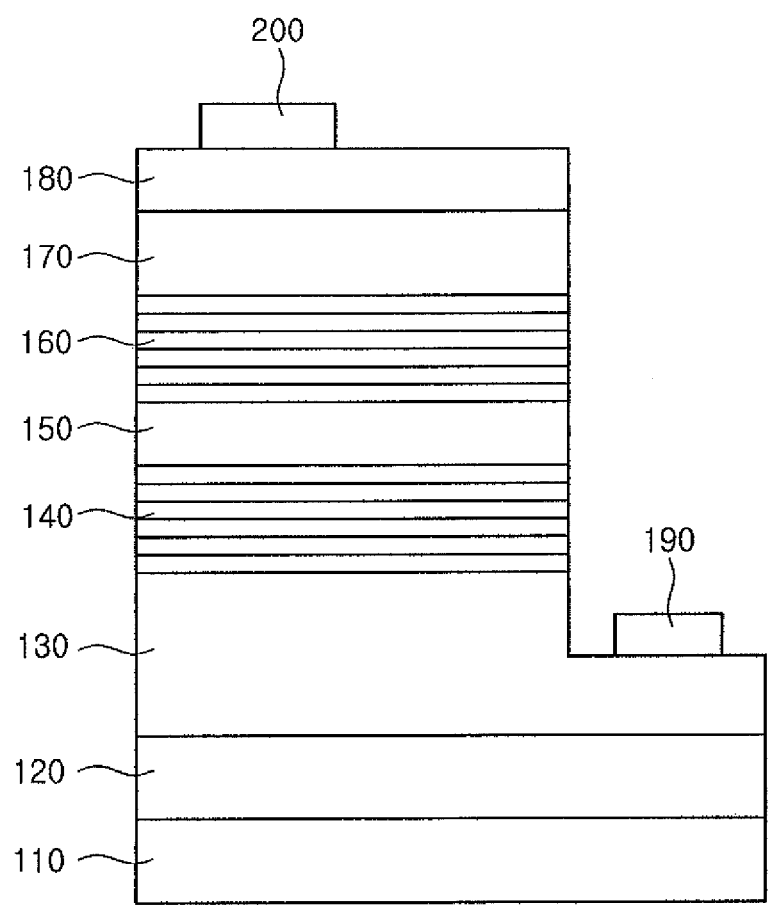
FIG. 1 is a schematic cross-sectional view illustrating a stack structure of a nitride semiconductor light emitting device according to an embodiment of the present invention.

Embodiments of the present invention will now be described in detail with reference to the accompanying drawings.

Exemplary embodiments of the present invention may, however, be embodied in many different forms and should not be construed as being limited to the embodiments set forth herein. In the drawings, the shapes and dimensions of elements may be exaggerated for clarity, and the same reference numerals will be used throughout to designate the same or like elements.

As used herein, the singular forms, "a", "an", and "the" are intended to include plural forms as well, unless the context clearly indicates otherwise.

Figure 2:
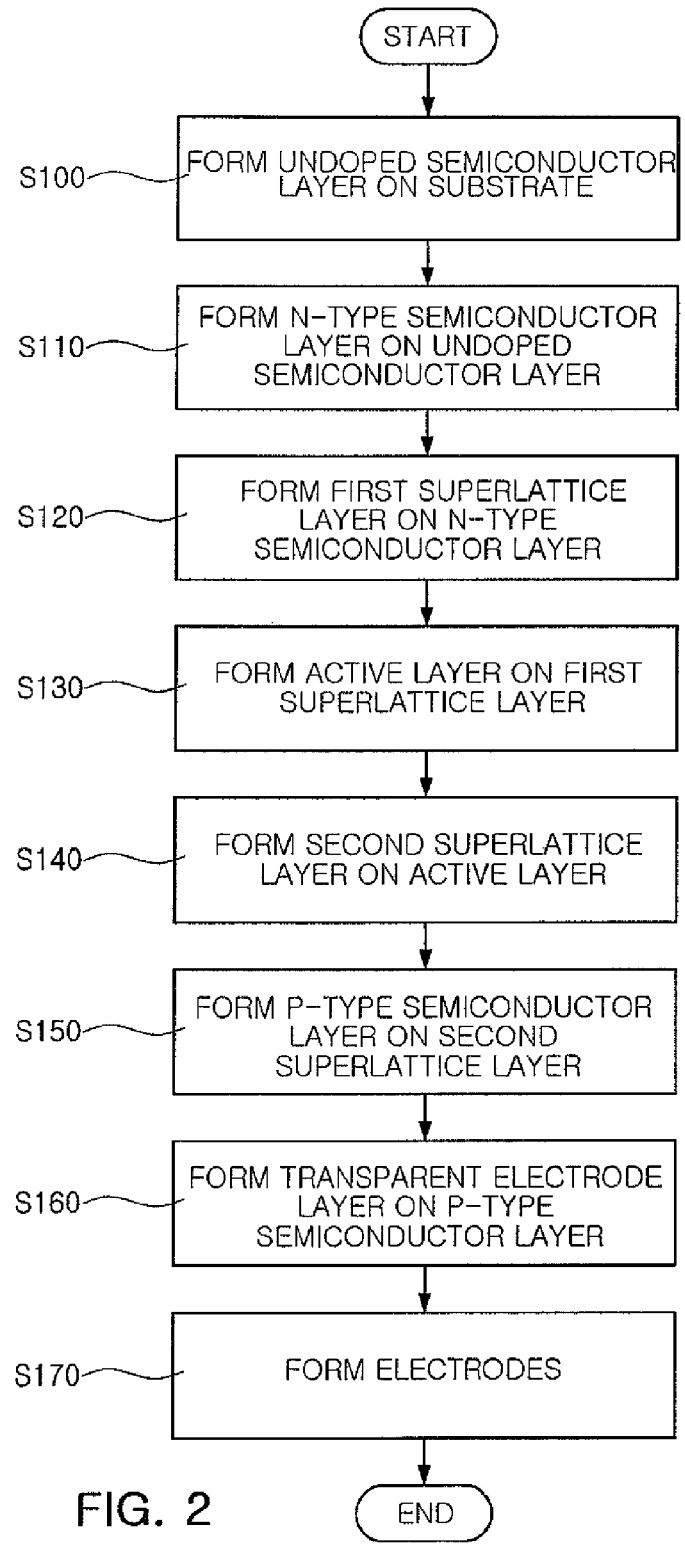
FIG. 2 is a flowchart illustrating a method of manufacturing a nitride semiconductor light emitting device according to an embodiment of the present invention.

FIG. 1 is a schematic cross-sectional view illustrating a stack structure of a nitride semiconductor light emitting device according to an embodiment of the present invention, and FIG. 2 is a flowchart illustrating a method of manufacturing a nitride semiconductor light emitting device according to an embodiment of the present invention.

With reference to FIG. 1, a nitride semiconductor light emitting device 100 according to an embodiment of the present invention includes, for example, a substrate 110, an undoped semiconductor layer 120, an n-type semiconductor layer 130, a first superlattice layer 140, an active layer 150, a second superlattice layer 160, a p-type semiconductor layer 170, a transparent electrode layer 180, an n-type electrode 190 and a p-type electrode 200.

The substrate 110 may be, for example, a wafer used for manufacturing a nitride semiconductor light emitting device. The substrate 110 may be formed of, for example, sapphire ($Al_2O_3$) or silicon carbide (SiC), without being limited thereto. For example, the substrate 110 may be a heterogeneous substrate suitable for the growth of nitride semiconductor layers, such as a silicon (Si) substrate, a gallium arsenide (GaAs) substrate, a spinel substrate or the like, or a homogeneous substrate such as a gallium nitride (GaN) substrate or the like.

The undoped semiconductor layer 120 may be formed, for example, as a u-GaN layer on the substrate 110 in operation S100. The undoped semiconductor layer 120 may be formed, for example, by providing ammonia ($NH_3$) and trimetal gallium (TMGa) at a growth temperature of approximately 700° C. In this case, the "undoped" semiconductor layer refers to a semiconductor layer not intentionally doped with any dopant, but there may be portions of a dopant inevitably included therein. For example, in a case in which a GaN semiconductor layer is grown by metal organic chemical vapor deposition (MOCVD), a concentration of a dopant, such as Si or the like, inevitably present in the semiconductor layer, may be within a range of approximately $10^{14}/cm^3$ to $10^{18}/cm^3$.

The n-type semiconductor layer 130 may be formed on the undoped semiconductor layer 120.

The n-type semiconductor layer 130 may be formed as, for example, an n-GaN layer doped with Si. The n-type semiconductor layer 130 may be grown by, for example, providing $NH_3$, TMGa and silane ($SiH_4$) gas including an n-type dopant such as Si or the like in operation S110.

According to the present embodiment, the first superlattice layer 140 may be formed by, for example, alternately stacking a plurality of nitride layers having different energy bandgaps on the n-type semiconductor layer 130 in operation S120. Here, the nitride layers having different energy bandgaps may be formed of semiconductor materials having, for example, a composition formula of $In_xAl_yGa_{(1-x-y)}N$ ($0 \leq x \leq 1$, $0 \leq y \leq 1$, and $0 \leq x+y \leq 1$) and doped with an n-type dopant. A two-dimensional electron gas (2DEG) layer (not shown) may be formed at an interface between the nitride layers of the first superlattice layer 140 having different energy bandgaps, due to energy band discontinuity therebetween. When voltage is applied thereto, a tunneling effect may occur due to an n+/p+ junction via the 2DEG layer. In this case, a cladding effect may be enhanced in the n-type semiconductor layer 130 and high carrier mobility may be secured in a region in which the 2DEG layer is formed, whereby a current spreading effect may be significantly increased (indicated by a plurality of fine lines in FIG. 1).

Here, a superlattice structure refers to a structure in which a plurality of excessively thin material layers having different properties, such as nitride layers or the like, are alternately stacked. Due to a quantum size effect, a semiconductor having a superlattice structure has different electrical/optical characteristics from a mixed crystal semiconductor.

The active layer 150 may be formed, for example, on the first superlattice layer 140 in operation S130.

The active layer 150 may have, for example, a single quantum well (SQW) structure or a multi quantum well (MQW) structure including a quantum well layer formed of $In_xGa_{1-x}N$ ($0<x<1$) and a quantum barrier layer formed of GaN.

Here, the active layer 150 may not be doped with a dopant in light of the characteristics of the active layer 150. A wavelength of light emitted from the active layer 150 may be controlled by, for example, adjusting a mole ratio of constituent materials. Therefore, the nitride semiconductor light emitting device may emit any one of infrared, visible and ultraviolet light according to the characteristics of the active layer 150.

The second superlattice layer 160 may be formed by, for example, alternately stacking a plurality of nitride layers having different energy bandgaps on the active layer 150 in operation S140. Here, the nitride layers having different energy bandgaps may be formed of semiconductor materials having, for example, a composition formula of $In_xAl_yGa_{(1-x-y)}N$ ($0 \leq x \leq 1$, $0 \leq y \leq 1$, and $0 \leq x+y \leq 1$) and partially or entirely doped with a p-type dopant.

The second superlattice layer 160 according to the present embodiment may have a superlattice structure having, for example, about three to about one hundred periods, each of which includes AlGaN/GaN/InGaN layers.

The superlattice layer according to the present embodiment is formed by, for example, repeatedly alternately stacking material layers having different energy bandgaps, and here, two layers or three or more layers may be alternately stacked, which will understood by those skilled in the art to which exemplary embodiments of the present invention pertains.

The second superlattice layer 160 may serve as an electron blocking layer blocking electrons from diffusing into the active layer 150, thereby increasing current spreading. Further, due to energy band discontinuity between the nitride layers having different energy bandgaps, the second superlattice layer 160 may serve as a capacitor with respect to holes, whereby light emission efficiency may be increased and an electrostatic discharge (ESD) resistance of the light emitting device may be strengthened.

The second superlattice layer 160 may be grown by, for example, a thin film crystal growth process, such as Metal Organic Chemical Vapor Deposition (MOCVD), Molecular Beam Epitaxy (MBE), or the like.

The second superlattice layer 160 may be doped with, for example, a p-type dopant such as Mg or the like. Here, an Mg doping concentration in an AlGaN layer should be, for example, about $1 \times 10^{19}/cm^3$ or more due to a high energy bandgap of the AlGaN layer. The Mg doping process is performed by supplying an Mg source gas such as, for example, $Cp_2Mg$ to a reactor, and due to a time delay when doped with Mg, the Mg doping concentration may be significantly different between a growth initiation period of the second superlattice layer 160 and a growth termination period thereof, even when the nitride layers of the superlattice layer are formed under the same conditions. Therefore, in the case in which the Mg source gas is continuously supplied to the reactor at an Mg flow rate allowing for the Mg doping concentration of the second superlattice layer 160 formed in the growth initiation period to be about $1 \times 10^{19}/cm^3$, the Mg doping concentration may be increased in the growth termination period. In this case, when the Mg doping concentration is excessively increased, a resistance value may be increased to thereby increase an operational voltage Vf.

That is, for example, when the Mg doping concentration of the superlattice layer is greater than about $1 \times 10^{20}/cm^3$, the resistance value is increased to thereby increase the operational voltage Vf. Therefore, the Mg doping concentration may range from, for example, about $1 \times 10^{19}/cm^3$ to about $1 \times 10^{20}/cm^3$.

In the present embodiment, the second superlattice layer 160 having a multilayer stack structure is doped with, for example, Mg as the p-type dopant, and here, a flow rate of the Mg source gas, $Cp_2Mg$ is differently adjusted in the growth initiation period and the growth termination period. That is, the second superlattice layer 160 may be formed by reducing the $Cp_2Mg$ flow rate in the growth termination period by, for example, no greater than about half of the $Cp_2Mg$ flow rate in the growth initiation period. That is, the $Cp_2Mg$ flow rate may be consistently maintained up to intermediate layers of the second superlattice layer 160 in the growth initiation period, and then the $Cp_2Mg$ flow rate may be reduced by, for example, no greater than about half of the initial $Cp_2Mg$ flow rate from above the intermediate layers of the second superlattice layer 160 in the growth termination period. In this manner, when the second superlattice layer 160 is formed by reducing the $Cp_2Mg$ flow rate, the Mg doping concentration of the second superlattice layer 160 is not significantly increased in the growth termination period, but is maintained below a certain level to thereby prevent the operational voltage Vf from being increased.

Thereafter, the p-type semiconductor layer 170 is formed on, for example, the second superlattice layer 160 in operation S150. The transparent electrode layer 180 is formed on, for example, the p-type semiconductor layer 170 in operation S160, and the transparent electrode layer 180 is made of, for example, indium tin oxide (ITO), zinc oxide (ZnO), ruthenium oxide (RuOx), titanium oxide (TiOx), iridium oxide (IrOx) or the like.

For example, as described above, after the transparent electrode layer 180 is formed above the substrate 110, a dry etching process is performed to thereby expose a portion of the n-type semiconductor layer 130.

For example, after the dry etching process, the n-type electrode 190 formed of titanium (Ti) or the like is deposited on the exposed portion of the n-type semiconductor layer 130 and the p-type electrode 200 formed of nickel (Ni) or the like is deposited on the transparent electrode layer 180 in operation S170.

<Experiment 1>

In Experiment 1, the flow rate of the Mg source gas, $Cp_2Mg$, was varied during the growth of the second superlattice layer 160, and the operational voltage Vf and light emission efficiency were measured according to variations in the $Cp_2Mg$ flow rate.

Figure 3:
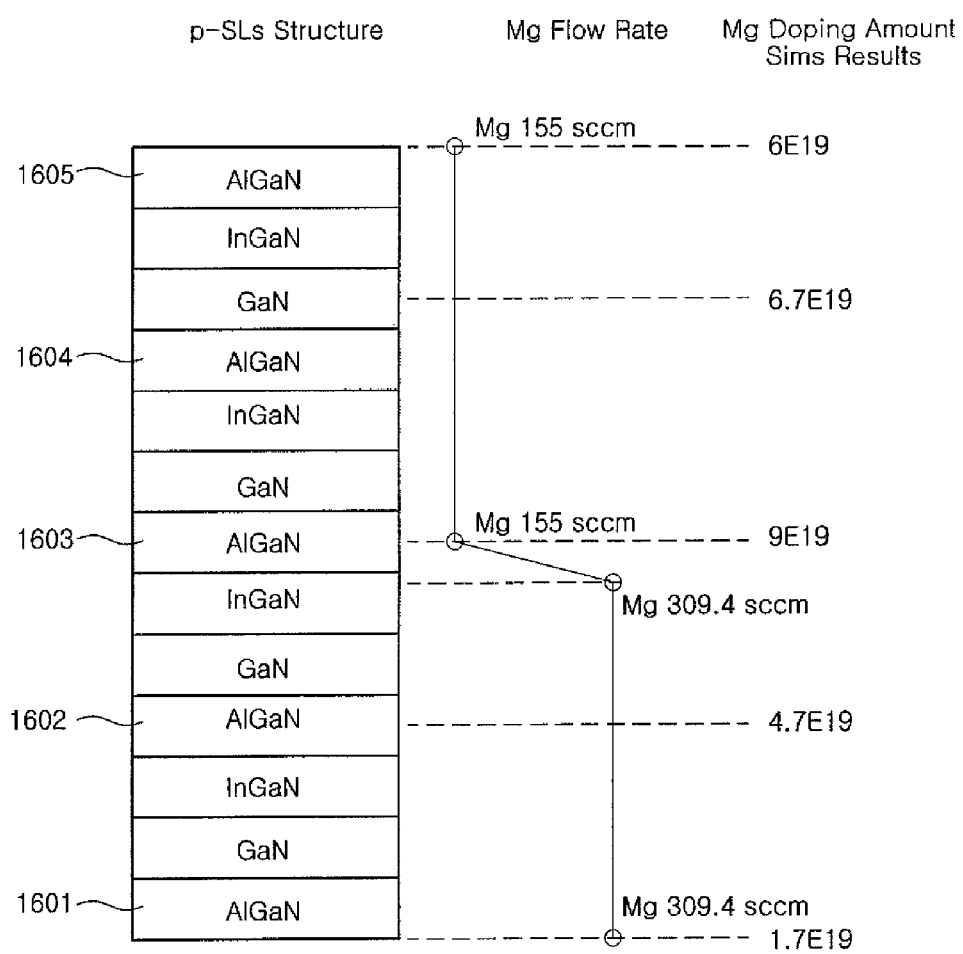
FIG. 3 is a graph illustrating a cross-sectional view of a second superlattice layer according to an embodiment of the present invention and a flow rate of Mg source gas provided as a p-type dopant for the second superlattice layer and Mg doping concentration according to variations in the flow rate of the Mg source gas.

FIG. 3 is a graph illustrating a cross-sectional view of the second superlattice layer 160 according to an embodiment of the present invention and the flow rate of the Mg source gas provided as the p-type dopant for the second superlattice layer 160 and the Mg doping concentration according to variations in the flow rate of the Mg source gas.

As shown in FIG. 3, the second superlattice layer 160 was formed by adjusting the $Cp_2Mg$ flow rate to be about 309 sccm in the growth initiation period, consistently maintaining the $Cp_2Mg$ flow rate, reducing the $Cp_2Mg$ flow rate to about 155 sccm when a thickness of the second superlattice layer 160 became about half of a desired thickness thereof, and then consistently maintaining the reduced $Cp_2Mg$ flow rate.

In this manner, the second superlattice layer 160 was formed by varying the $Cp_2Mg$ flow rate and the Mg doping concentration thereof was measured as follows: when the $Cp_2Mg$ flow rate was about 309 sccm, an AlGaN layer 1601 located in the growth initiation period had an Mg doping concentration of about $1.7 \times 10^{19}/cm^2$, an AlGaN layer 1602 located in the next period had an Mg doping concentration of about $4.7 \times 10^{19}/cm^2$, and an AlGaN layer 1603 located in the next period had an Mg doping concentration of about $9 \times 10^{19}/cm^2$. At this time, the $Cp_2Mg$ flow rate was reduced by about half. An AlGaN layer 1604 located in the next period had an Mg doping concentration of about $6.7 \times 10^{19}/cm^2$, and an AlGaN layer 1605 located in the next period had an Mg doping concentration of about $6 \times 10^{19}/cm^2$. When the $Cp_2Mg$ flow rate was reduced by about half, the Mg doping concentration was not significantly increased in the growth termination period as compared with in the growth initiation period, but rather was maintained to be less than about $1 \times 10^{20}/cm^3$. Therefore, the Mg doping concentration was consistently maintained below a certain level to thereby prevent the operational voltage Vf from being increased.

Figure 4:
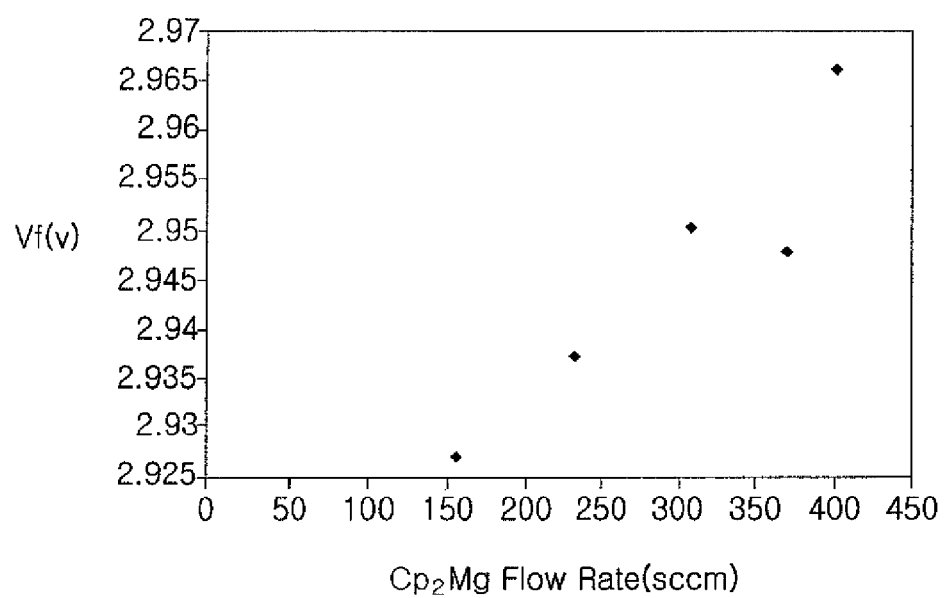
FIG. 4 is a graph illustrating an operational voltage according to a $Cp_2Mg$ flow rate.
Figure 5:
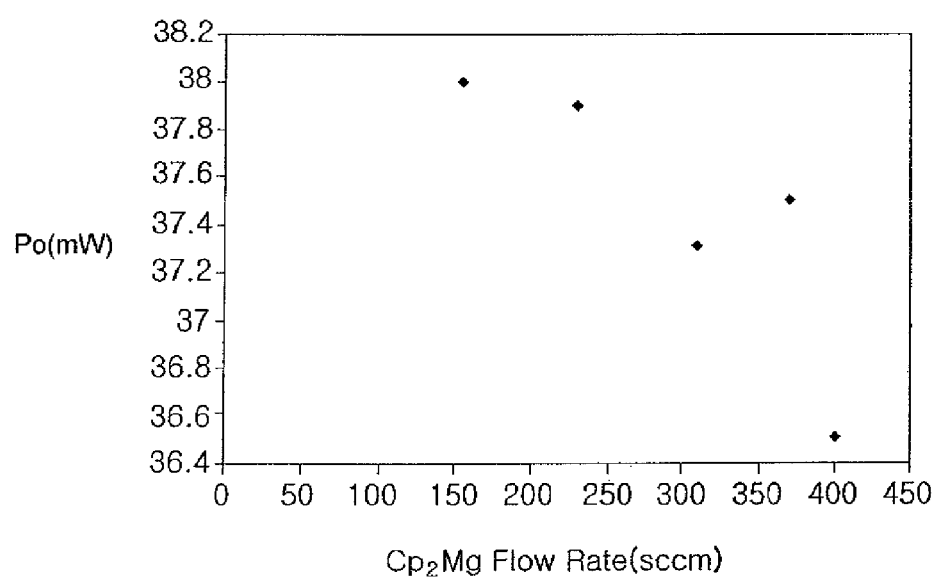
FIG. 5 is a graph illustrating an amount of light emitted according to a $Cp_2Mg$ flow rate.

FIG. 4 is a graph illustrating an operational voltage Vf(v) according to a $Cp_2Mg$ flow rate, and FIG. 5 is a graph illustrating an amount Po (mW) of light emitted according to a $Cp_2Mg$ flow rate. Table 1 shows the operational voltage Vf(v) and the amount Po(mW) of light emitted according to the $Cp_2Mg$ flow rate.

TABLE 1

| Cp$_2$Mg (sccm) | Vf (V) | Po (mW) |
|---|---|---|
| 309.4 | 2.95 | 37.3 |
| 232 | 2.94 | 37.9 |
| 155 | 2.93 | 38.0 |
| 371 | 2.95 | 37.5 |
| 402 | 2.97 | 36.5 |

As shown in FIG. 4, as the Cp$_2$Mg flow rate is reduced, the operational voltage Vf(v) is reduced. On the other hand, as shown in FIG. 5, even when the Cp$_2$Mg flow rate is reduced, the Mg doping concentration is consistently maintained below a certain level, whereby the amount Po (mW) of emitted light is maintained or increased.

Therefore, in the case in which the second superlattice layer 160 is formed by using Mg as the p-type dopant, and when the second superlattice layer 160 is formed by reducing the Cp$_2$Mg flow rate in the growth termination period by no greater than about half of the flow rate in the growth initiation period, the operational voltage Vf(v) may be reduced and the amount Po(mW) of emitted light may be consistently maintained or increased, whereby a light emitting device having increased light emission efficiency may be manufactured.

As set forth above, according to embodiments of the invention, a nitride semiconductor light emitting device having increased light emission efficiency can be manufactured.

Having described exemplary embodiments of the present invention, it is further noted that it is readily apparent to those of ordinary skill in the art that various modifications may be made without departing from the spirit and scope of the invention which is defined by the metes and bounds of the appended claims.

What is claimed is:

1. A semiconductor light emitting device, comprising:
an n-type semiconductor layer;
an active layer disposed on the n-type semiconductor layer;
a p-type semiconductor layer disposed on the active layer; and
a superlattice layer disposed between the active layer and the p-type semiconductor layer, wherein the superlattice layer includes a plurality of alternately stacked nitride layers including In$_x$Al$_y$Ga$_{(1-x-y)}$N (0≤x≤1, 0≤y≤1, and 0≤x+y≤1) having different energy bandgaps;
wherein the superlattice layer consists of a first region and a second region disposed on the first region,
the first region contains the p-type dopant, a concentration of which increases in a direction toward the p-type semiconductor layer in the entire first region, and
the second region contains the p-type dopant, a concentration of which decreases in a direction toward the p-type semiconductor layer in the entire second region, and
wherein the p-type semiconductor layer contacts the superlattice layer.

2. The semiconductor light emitting device of claim 1, wherein the dopant concentration of the first region and second region is about 1+10$^{19}$/cm$^3$ to about 1×10$^{20}$/cm$^3$, respectively.

3. The semiconductor light emitting device of claim 1, wherein the superlattice layer includes the plurality of alternately stacked nitride layers including In$_x$Al$_y$Ga$_{(1-x-y)}$N (0≤x≤1, 0≤y≤1, and 0≤x+y≤1) in amounts of about three to about one hundred periods.

4. The semiconductor light emitting device of claim 1, wherein the superlattice layer comprises a plurality of AlGaN/GaN/InGaN layers which are alternately stacked.

5. The semiconductor light emitting device of claim 1, further comprising:
a n-type doped superlattice layer disposed between the n-type semiconductor layer and the active layer.

6. The semiconductor light emitting device of claim 5, wherein the n-type doped superlattice layer includes a plurality of alternately stacked nitride layers including In$_x$Al$_y$Ga$_{(1-x-y)}$N (0≤x≤1, 0≤y≤1, and 0≤x+y≤1) having different energy bandgaps from each other.

7. The semiconductor light emitting device of claim 1, wherein the p-type dopant includes magnesium (Mg).

8. The semiconductor light emitting device of claim 1, further comprising a transparent electrode layer disposed on the p-type semiconductor layer.

9. The semiconductor light emitting device of claim 8, further comprising a p-type electrode disposed on the transparent electrode layer.

10. The semiconductor light emitting device of claim 9, wherein the p-type electrode includes nickel (Ni).

11. The semiconductor light emitting device of claim 1, further comprising an n-type electrode disposed on the n-type semiconductor layer.

12. The semiconductor light emitting device of claim 11, wherein the n-type electrode includes titanium (Ti).

13. A semiconductor light emitting device, comprising:
an n-type semiconductor layer;
an active layer disposed on the n-type semiconductor layer;
a p-type semiconductor layer disposed on the active layer; and
a superlattice layer disposed between the active layer and the p-type semiconductor layer and including a plurality of AlGaN/GaN/InGaN layers which are periodically disposed;
wherein a plurality of AlGaN layers of the plurality of AlGaN/GaN/InGaN layers contains a p-type dopant, a concentration of which increases and then decreases from an initiation period of the superlattice layer formed to be adjacent to the active layer to termination period of the superlattice layer formed to be adjacent to the p-type semiconductor layer.

14. The semiconductor light emitting device of claim 13, wherein the superlattice layer is doped with the p-type dopant and the dopant concentration of the superlattice layer is about 1×10$^{19}$/cm$^3$ to about 1×10$^{20}$/cm$^3$.

15. The semiconductor light emitting device of claim 13, further comprising:
a n-type doped superlattice layer disposed between the n-type semiconductor layer and the active layer.

16. The semiconductor light emitting device of claim 15, wherein the n-type doped superlattice layer includes a plurality of alternately stacked nitride layers including In$_x$Al$_y$Ga$_{(1-x-y)}$N (0≤x≤1, 0≤y≤1, and 0≤x+y≤1) having different energy bandgaps from each other.

* * * * *